U.S. Patent Number: 5,517,036
Date of Patent: May 14, 1996

United States Patent [19]
Semba et al.

[54] TAPE CARRIER, AND TEST APPARATUS FOR THE SAME

[75] Inventors: Shinji Semba; Shinji Enoshima; Kunio Kobayashi, all of Itami; Isamu Yamamoto, Sagamihara, all of Japan

[73] Assignee: Mitsubishi Denki Kabushiki Kaisha, Tokyo, Japan

[21] Appl. No.: 426,473

[22] Filed: Apr. 20, 1995

Related U.S. Application Data

[63] Continuation of Ser. No. 30,875, Mar. 12, 1993, abandoned.

[30] Foreign Application Priority Data

Oct. 30, 1992 [JP] Japan ...................... 4-293093

[51] Int. Cl.[6] .......................... H01L 23/58; H01L 23/495
[52] U.S. Cl. .......................... 257/418; 257/207; 257/668; 257/691
[58] Field of Search .............................. 257/48, 668, 691, 257/207

[56] References Cited

U.S. PATENT DOCUMENTS

| | | | |
|---|---|---|---|
| 4,701,781 | 10/1987 | Sankhagowit | 257/668 |
| 4,949,155 | 8/1990 | Tajima et al. | 257/668 |
| 4,977,441 | 12/1990 | Ohtani et al. | 257/668 |

FOREIGN PATENT DOCUMENTS

| | | | |
|---|---|---|---|
| 53-085159 | 7/1978 | Japan | 257/668 |
| 59-023555 | 2/1984 | Japan | 257/668 |
| 61-090453 | 5/1986 | Japan | 257/668 |
| 02079442 | 3/1990 | Japan | 257/668 |
| 02129941 | 5/1990 | Japan | 257/668 |
| 04267352 | 9/1992 | Japan | 257/668 |
| 04345043 | 12/1992 | Japan | 257/668 |

*Primary Examiner*—Sara W. Crane
*Assistant Examiner*—T. M. Arroyo
*Attorney, Agent, or Firm*—Leydig, Voit & Mayer

[57] ABSTRACT

A tape carrier includes an elongated electrically insulating tape divided into a plurality of separable tape sections. A semiconductor chip is mounted at each of a plurality of semiconductor device mounting portions having a plurality of leads on each of the tape sections. The semiconductor chips are connected to the respective leads. A plurality of testing connection terminals on each of the tape sections are connected to respective testing connection terminals by testing wires.

11 Claims, 11 Drawing Sheets

TAPE CARRIER, AND TEST APPARATUS FOR THE SAME

This disclosure is a continuation of application Ser. No. 08/030,875, filed Mar. 12, 1993 now abandoned.

BACKGROUND OF THE INVENTION

This invention relates to a tape carter for use in a tape carrier package (TCP). This invention also relates to a testing method and a test apparatus for semiconductor devices molted on the tape carrier.

FIG. 9 illustrates one example of a conventional tape carrier for mounting semiconductor devices. In FIG. 9, the conventional tape carrier 1 has mounted thereon a plurality of semiconductor devices 2 disposed at regular intervals. The tape carrier 1 is mounted on a reel 3. Perforations 4 are formed along both sides of the tape carrier 1 at the same intervals as that of the semiconductor devices 2. During manufacture and test, the semiconductor devices 2 mounted on the tape carrier 1 are fed and held in place by sproket wheels (not shown) engaging the perforations 4. FIG. 10 is an enlarged top plan view of the semiconductor devices 2 mounted on the tape carrier 1. At a center portion of each of the semiconductor devices 2, a semiconductor chip 6 is mounted. A plurality of leads 7 extend outwardly from each of the semiconductor devices 2. The leads 7 are electrically connected to the outer terminals 5 which are mounted on both sides of the each semiconductor device 2.

When it is desired to carry out a burn-in test, each of the semiconductor devices 2 mounted on the conventional tape carrier 1, as illustrated in FIG. 10, is individually cut off from the tape carrier 1 into separate semiconductor devices 2 as illustrated in FIG. and each of the semiconductor devices 2 is inserted into a socket 8 which has a plurality of socket terminals 9 disposed correspondingly to the outer terminals 5 of the semiconductor device 2. After the semiconductor device 2 is inserted into the socket 8, the outer terminals 5 and the socket terminals 9 are electrically connected. FIG. 13 illustrates a testing board 10 which is used in a test such as a burn-in test. As illustrated in FIG. 13, a number of carrier sockets 11 are disposed within the testing board 10. A board terminal 12 is attached to one side of the testing board 10 and is connected to terminals (not shown) disposed within the carrier sockets 11 by wires mounted within the testing board 10.

When the sockets 8 into which the semiconductor devices 2 are inserted are put in the carrier sockets 11 of the testing board 10, the outer terminals 5 of the semiconductor devices 2 are electrically connected to the board terminal 12 by the socket terminals 9 and the terminals (not shown) within the carrier socket 11. After the testing board 10 is put in a constant temperature tank such as a burn-in tank (See FIG. 4), the board terminal 12 is set in the board connector (not shown) disposed within the constant temperature tank for a burn-in test of the semiconductor device 2. A burn-in test is a reliability test in which a semiconductor device 2 has applied to it a voltage under a high temperature (as an environment stress) for a specified number of testing hours, to detect a potential failure in a semiconductor device 2 as a result of manufacturing to prevent an early failure after shipping or forwarding. After the burn-in test, each of the semiconductor devices 2 is taken out from the testing board 10 and the sockets 8.

In the conventional tape carrier 1 and semiconductor device 2 constructed as described above, in the burn-in test process, the semiconductor devices 2 must be cut individually from the tape carrier 1 and put in the sockets 8, the sockets 8 are further put in the carrier sockets 11 within the testing board 10 and the testing board 10 is put in the burn-in tank for the burn-in test. Therefore, many processes such as, for example, cutting out, putting in the sockets and putting in the testing board, and taking out from the testing board and the sockets are needed. Further, a lot of sockets 8 and the testing board 10 are required. In the final test of the semiconductor device 2 after the burn-in test, the semiconductor devices 2 must be treated individually and tested separately. There, productivity is low and cost are high.

SUMMARY OF THE INVENTION

Accordingly, one object of the present invention is to provide a tape carrier free from the above-discussed problems of the conventional tape carrier.

Another object of the present invention is to provide a tape carrier having a plurality of separable tape sections each holding a plurality of semiconductor devices thereon during all testing processes, for example, from a burn-in test to a separate final test.

A further object of the present invention is to provide a method for testing semiconductor devices in which testing wires of each of the semiconductor devices that failed the test can be disconnected before the subsequent test.

Another object of the present invention is to provide a semiconductor device test apparatus in which the individual semiconductor devices are not required to be separated from each other and in which a plurality of semiconductor devices on the tape sections can be tested together.

With the above objects in view, the tape carrier of the present invention comprises an elongated electrically insulating tape divided into a plurality of separable tape sections including a plurality of semiconductor device mounting portions. The semiconductor device mounting portions each have a plurality of leads for electrical connection to a semiconductor chip. A plurality of testing connection terminals are disposed on each of the tape sections along at least one of the outer edges thereof. Further, a plurality of testing wires are disposed on each of the tape sections, and all of the leads are connected to the testing connection terminals by the testing wires.

A plurality of perforations are formed along both sides of the elongated tape for feeding and positioning the tape carrier. During the testing process, a positioning pin attached to a support device in a semiconductor device test apparatus is inserted into the perforations to position and hold the tape carrier in place.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
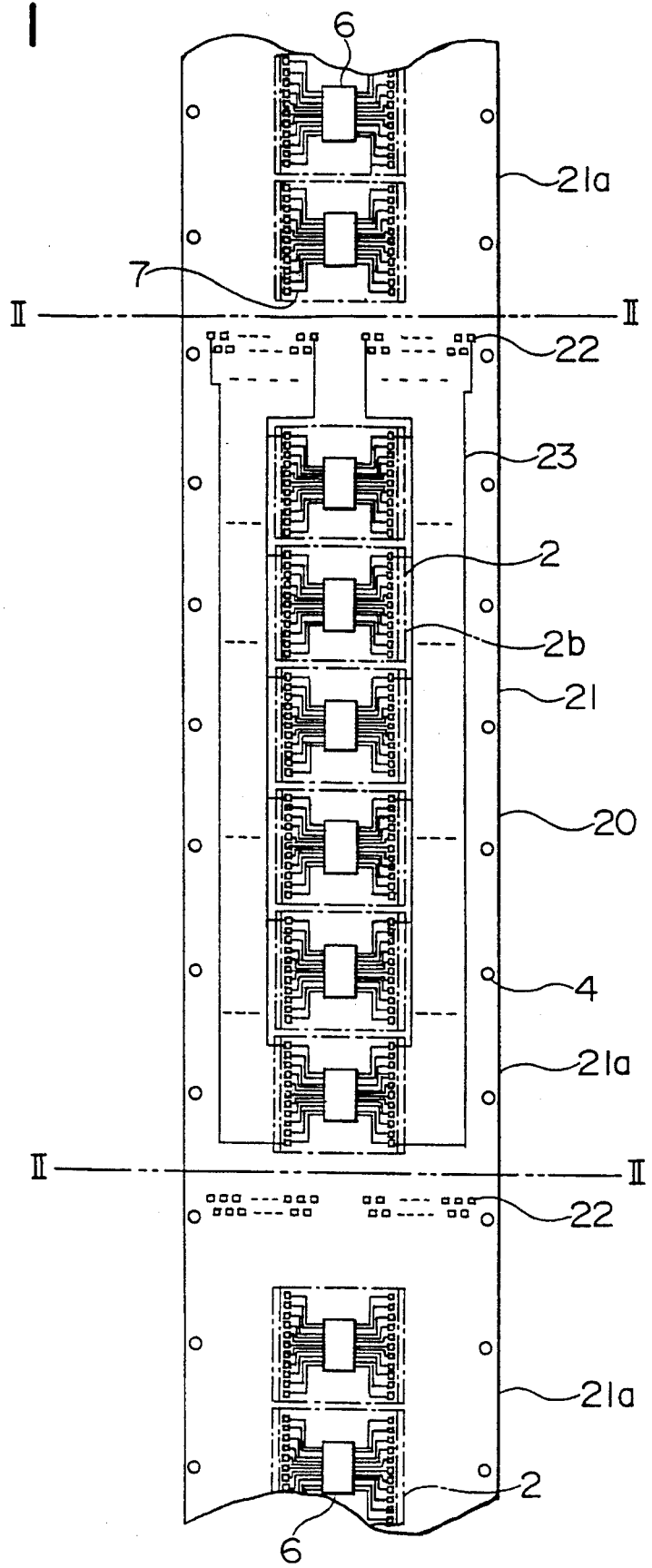
FIG. 1 is a fragmental top plan view of an embodiment of the tape carrier of the present invention.

FIG. 1 illustrates a tape carrier 21 of the present invention, which comprises an elongated electrically insulating tape 20 divided into a plurality of separable tape sections 21a along each of lines II—II. A plurality of semiconductor device mounting portions 2b are formed on each of the tape sections 21a and each tape section has a plurality of leads 7 for electrical connection to a semiconductor chip 6. A plurality of testing connection terminals 22 are present on each of the tape sections 21a along one of outer edges thereof. A plurality of testing wires 23 are present on each of the tape sections 21a. (In FIG. 1, only some of the testing wires 23 are illustrated.) Each of the leads 7 is connected to one of the testing connection terminals 22 through the testing wires 23. The semiconductor device mounting portions 2b are disposed at regular intervals. Between each of the tape sections 21a, there are, however, specified intervals for cutting along phantom lines II—II. As illustrated in FIG. 1, a semiconductor chip 6 is mounted on each of the semiconductor device mounting portions 2b. Each of the semiconductor chips 6 and the leads 7 are electrically connected to each other as the semiconductor device 2. Further, a plurality of perforations 4 are present at regular intervals corresponding to the semiconductor devices 2 along both sides of the elongated tape 20 for feeding and positioning the tape carrier 21 during manufacturing and testing.

Figure 2:
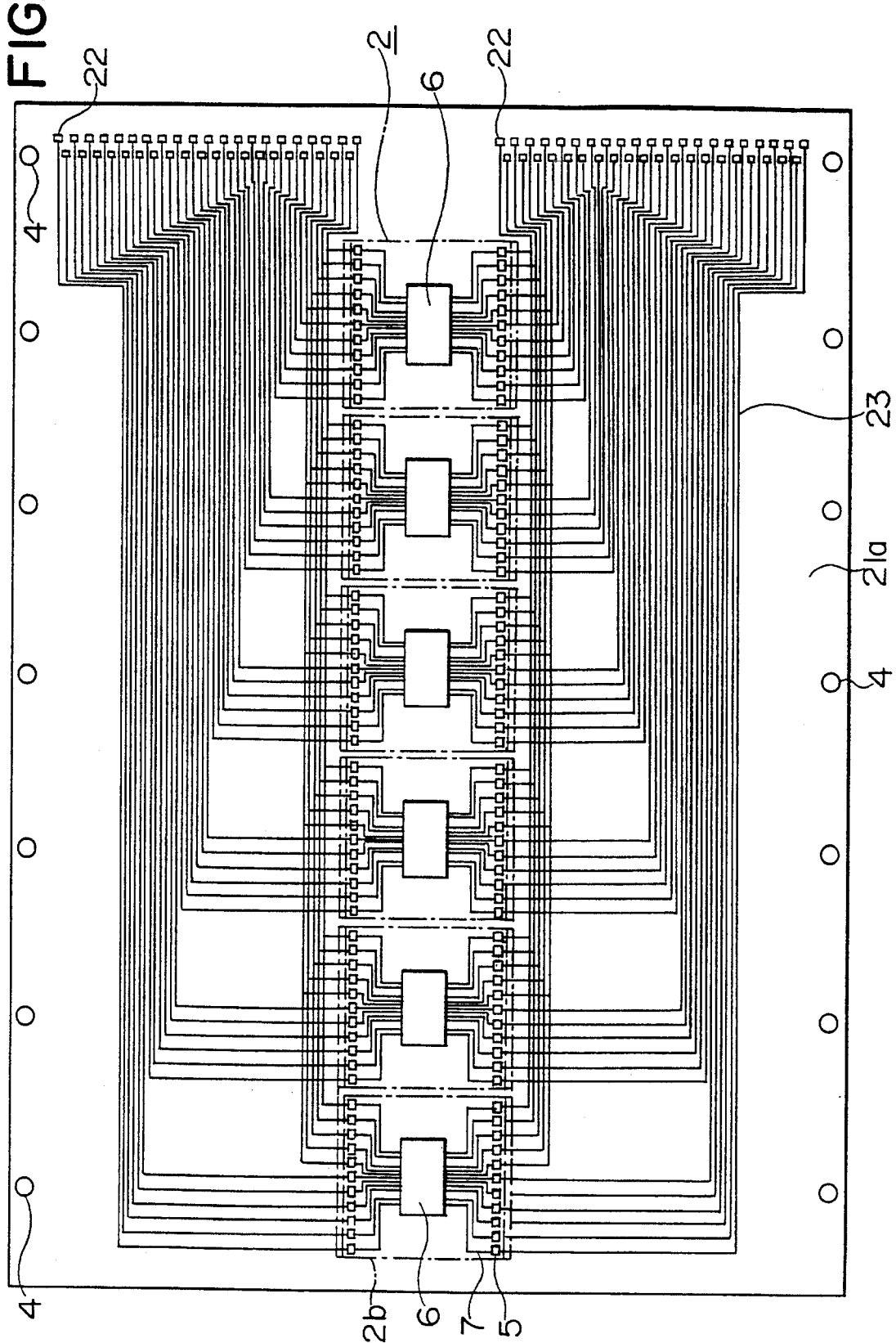
FIG. 2 is a top plan view of the tape section cut from the elongated tape carrier illustrated in FIG. 1.

FIG. 2 illustrates one of the tape sections 21a which is formed by cutting the elongated tape carrier 21 along each of the phantom lines II—II in FIG. 1. In FIG. 2, intervals between the testing wires 23 and the testing connection terminals 22 are illustrated in larger scale to clearly illustrate the electrical construction of the tape section 21a of the present invention. So, the width of the tape section 21a is illustrated as fairly wide. In practice, the testing wires 23 and the testing connection terminals 22 etc. are mounted compactly and accurately, so that the ratio of the width of the tape section 21a to its length is at most that illustrated in FIG. 1. As illustrated in FIG. 2, on each of the tape sections 21a, the semiconductor device mounting portions 2b are disposed and the semiconductor chips 6 are mounted on the center portions of respective semiconductor device mounting portions 2b. The outer terminals 5 are mounted on and aligned along both sides of each of the semiconductor device mounting portions 2b. The semiconductor chip 6 and the surrounding outer terminals 5 are connected by the leads 7 to form the semiconductor device 2. The testing connection terminals 22 are disposed in two rows along one of outer edges of the tape section 21a in the width direction. The testing connection terminals 22 are electrically connected to the respective outer terminals 5 of the semiconductor device 2 by the testing wires 23.

Figure 3:
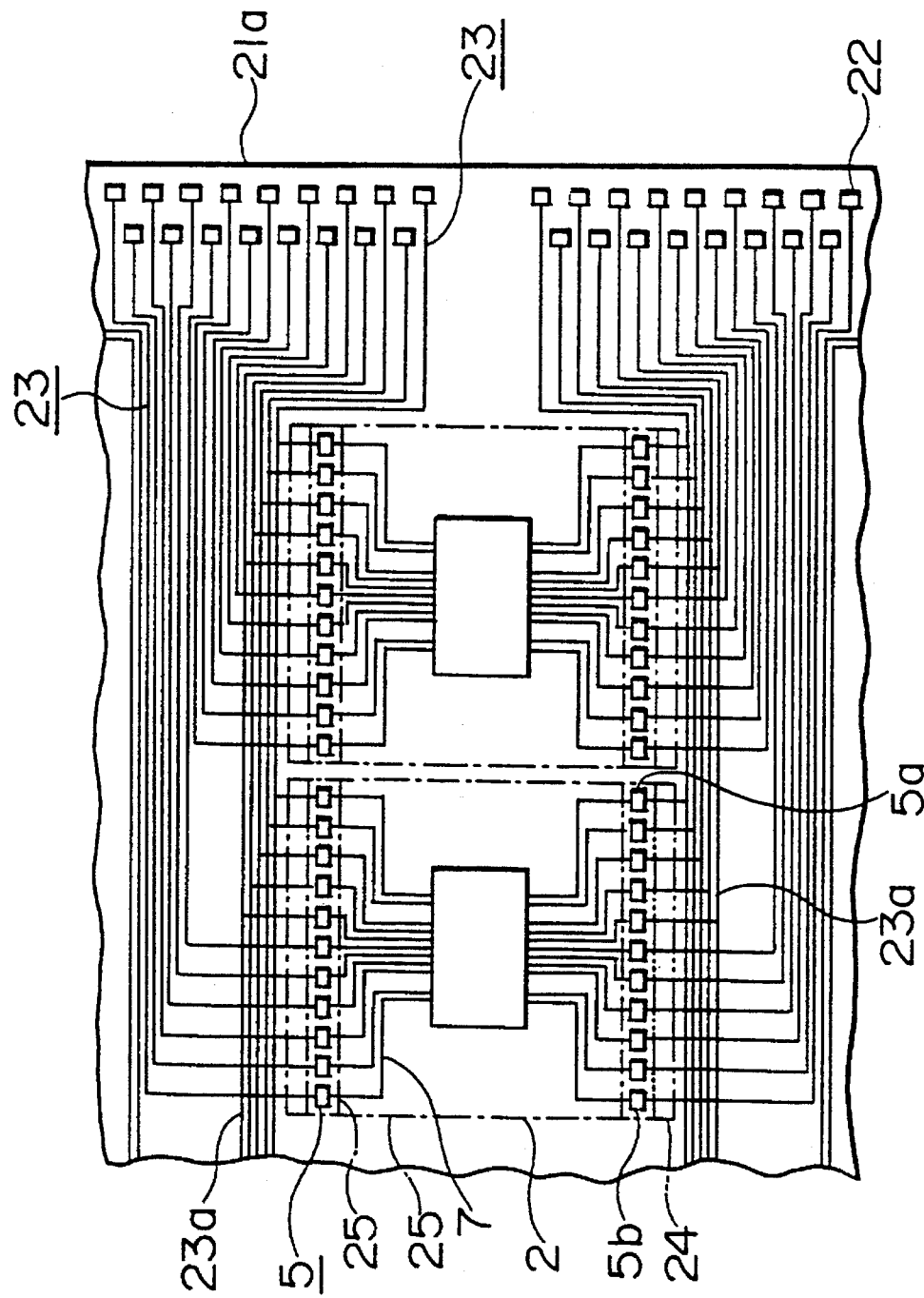
FIG. 3 is an enlarged fragmental top plan view of testing wires on each of the tape sections illustrated in FIG. 2.

FIG. 3 is an enlarged fragmental top plan view of the testing wires 23 on the tape section 21a. There are input outer terminals 5a and output outer terminals 5b among the outer terminals 5. As illustrated in FIG. 3, the input outer terminals 5a and the power sources (not shown) for a plurality of the semiconductor devices 2 are connected in common to the respective testing connection terminals 22 by the respective common testing wires 23a. The output outer terminals 5b are separately electrically connected to the respective testing connection terminals 22 by the respective testing wires 23. Thus, each of the outer terminals 5 is connected to one of the testing connection terminals 22, so that the semiconductor devices 2 need not be individually cut out and they can be tested one by one through the testing connection terminals 22 in several final tests while mounted on the tape sections 21a.

When any of the semiconductor devices 2 fails a pre-test and is rejected before the burn-in test, the testing wires 23 for the devices 2 to be rejected are disconnected by, for example, cutting out tape material in a slender rectangle enclosed by a phantom line 24 of FIG. 3 together with the testing wires 23 thereon. This prevents the rejected semiconductor device 2 from burning in a burn-in tank 30 (See FIG. 4) in response to a voltage applied during the burn-in test.

Figure 4:
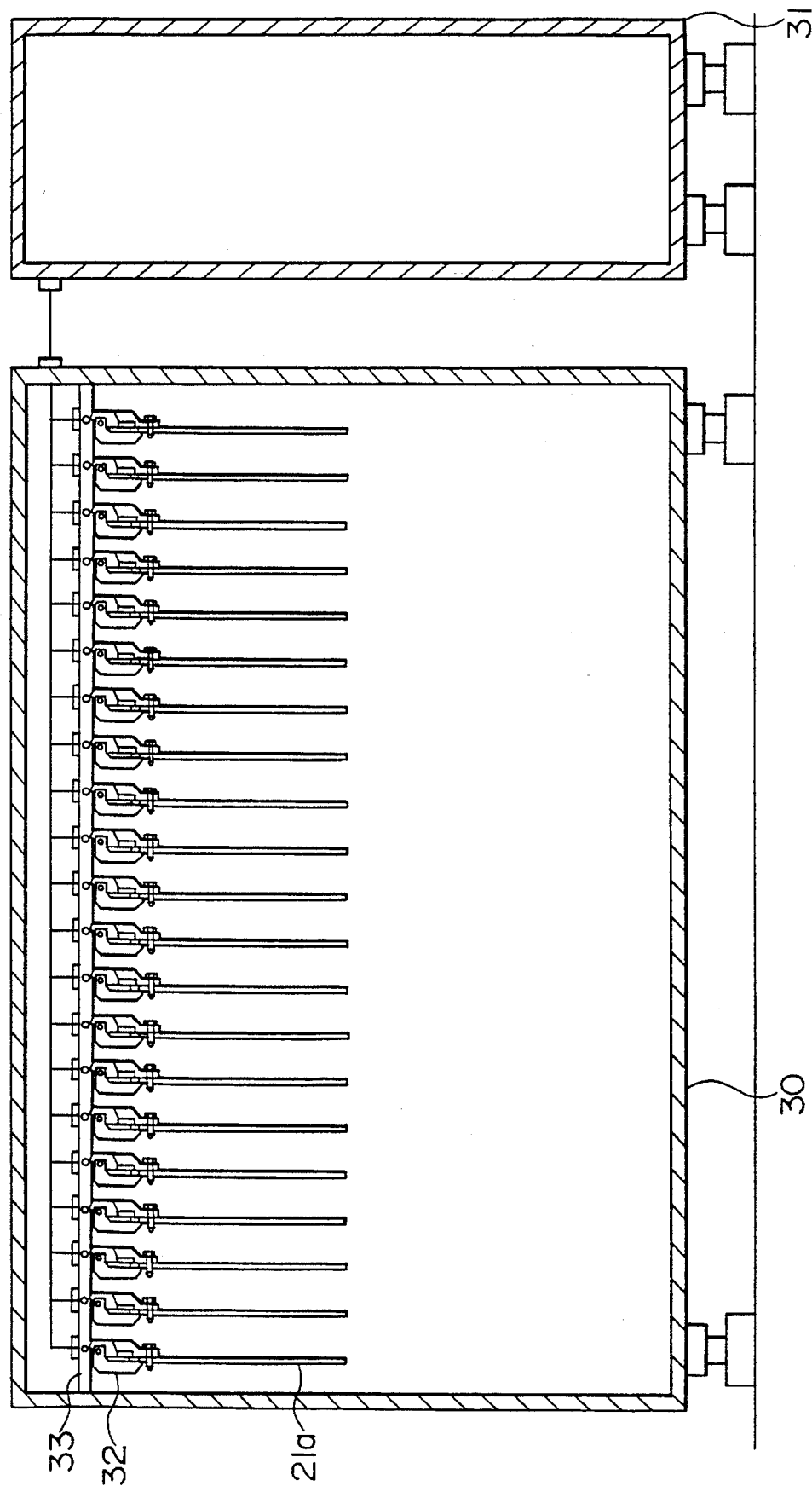
FIG. 4 is a schematic sectional view of the semiconductor device burn-in test apparatus of the present invention.

FIG. 4 illustrates the semiconductor device test apparatus of the present invention. As illustrated in FIG. 4, the semiconductor device test apparatus comprises a constant temperature tank 30 such as a burn-in tank and tester 31 such as a burn-in tester installed outside of the constant temperature tank 30. A beam 33 is attached to the upper part in the constant temperature tank 30. Supporting devices 32 are attached to the beam 33 in a line and are suspended therefrom. The supporting device 32 has a contactor device 37 (See FIG. 5) mounted thereon for making electrical contact with all of the testing connection terminals 22. During the burn-in test, each of the tape sections 21a is supported and hung by the supporting devices 32 at a portion near the testing connection terminals 22 thereof within the constant temperature tank 30. The semiconductor devices 2 are tested by applying a voltage at a high temperature such as 125° for a specified number of testing hours, for example, for 20–24 hours while being held on the tape sections 21a, thereby to detect a potential failure in the semiconductor devices 2 which as a result of a process of manufacturing.

Figure 5:
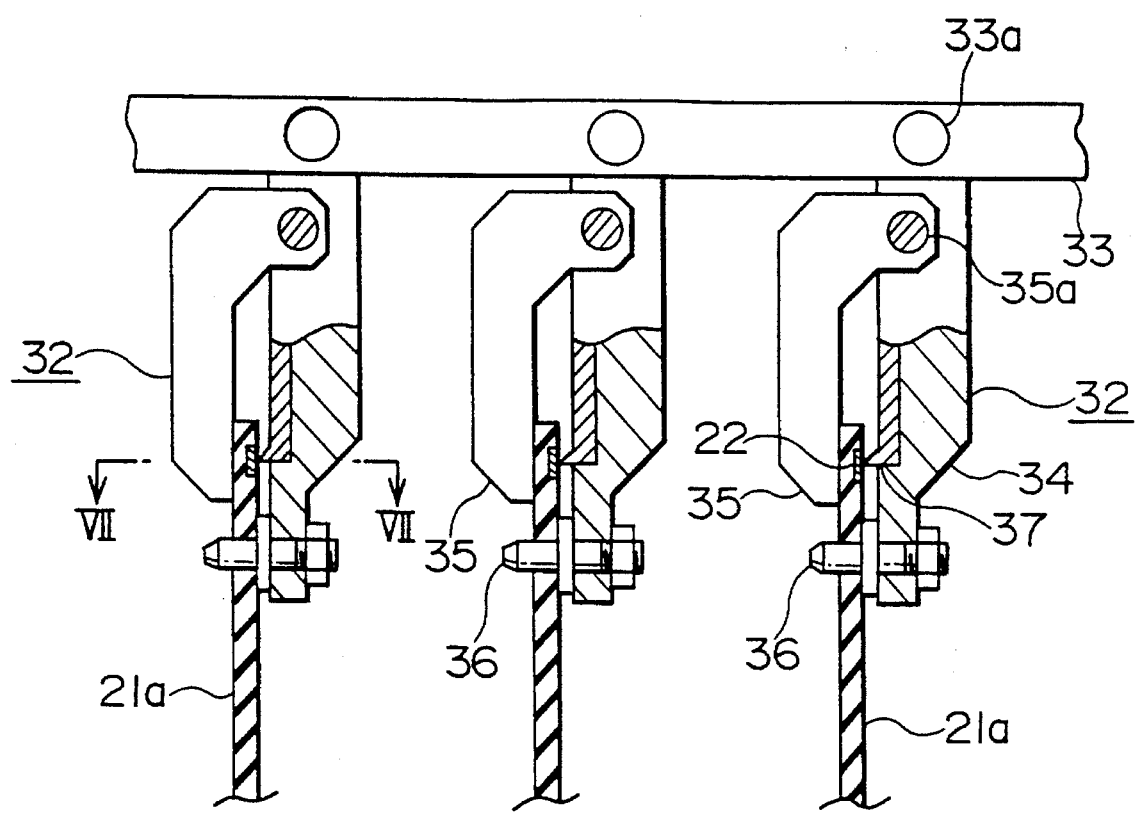
FIG. 5 is a side view of the supporting device of the test apparatus illustrated in FIG. 4.
Figure 6:
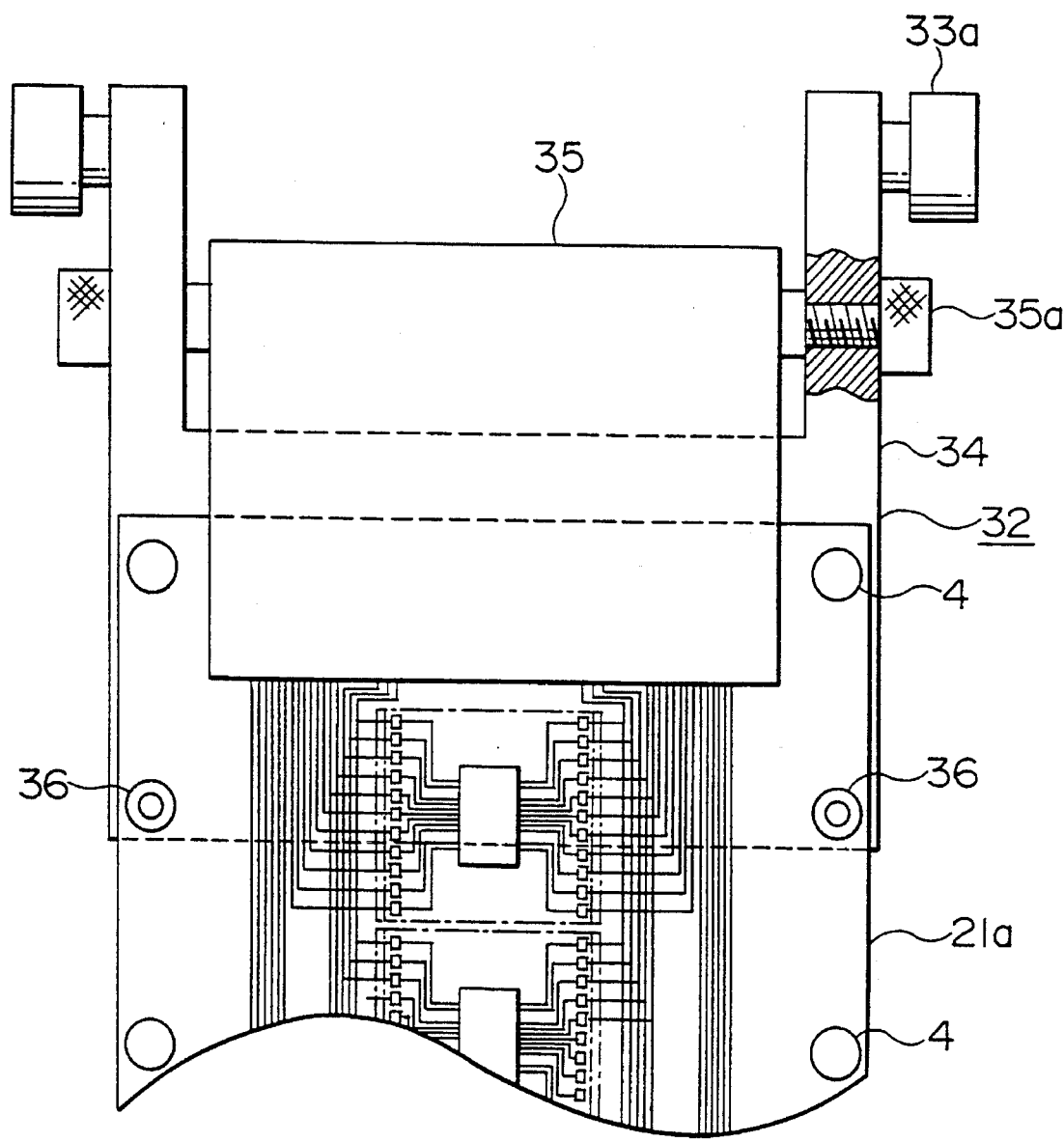
FIG. 6 is an enlarged front view of the supporting device illustrated in FIG. 5.

FIG. 5 is a side view of the support device 32 and FIG. 6 shows its front view. The support device 32 comprises a supporting base 34 for supporting the tape section 21a at the portion near the testing connection terminals 22 thereof, a swinging holder 35 hinged to the supporting base 34 at a fastening means 35a such as a screw and the contactor device 37 mounted thereon. Further, as also illustrated in FIG. 6, positioning pins 36 are attached to the lower edge of the supporting base 34 at both sides.

Figure 7:
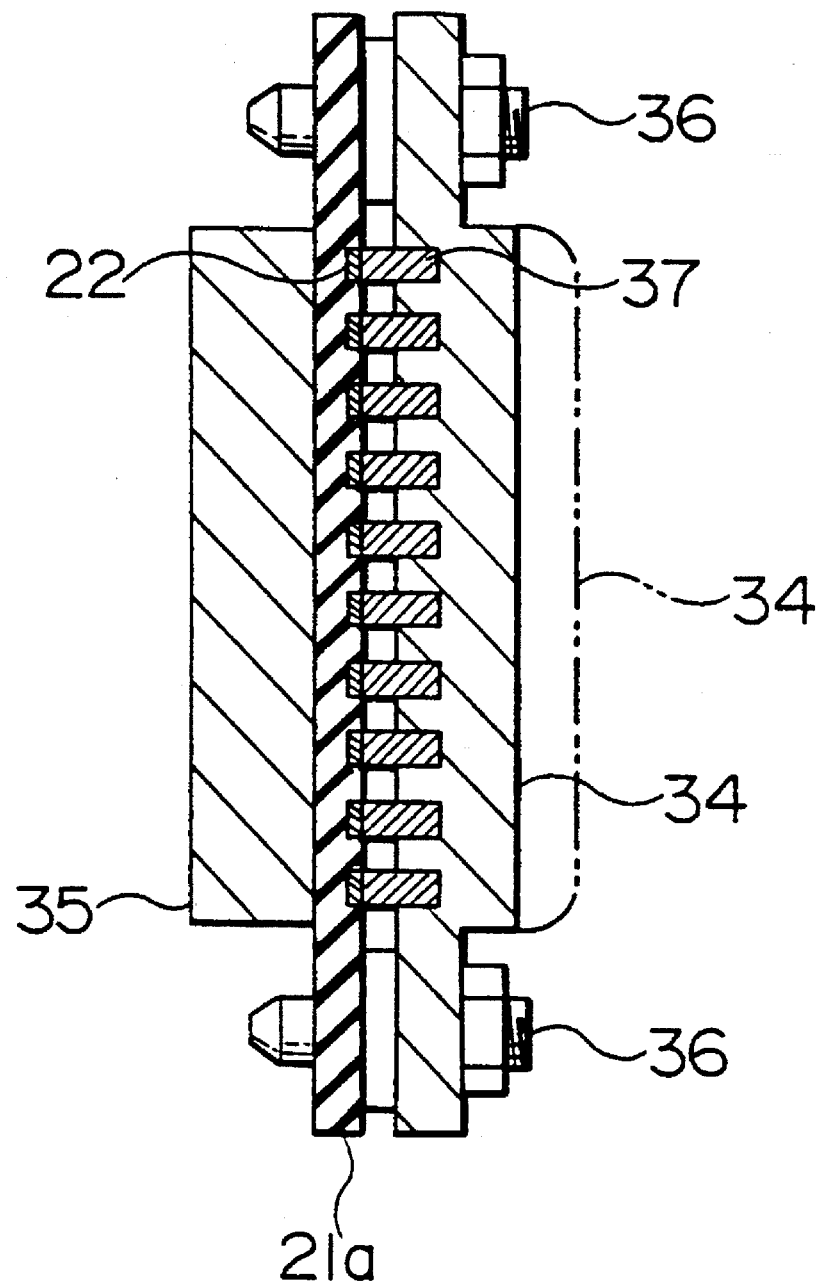
FIG. 7 is a sectional view taken on line VII—VII in FIG. 5.

FIG. 7 is a sectional view taken along line VII—VII in FIG. 5. As illustrated in FIG. 7, the contactor device 37 includes a plurality of contact elements which are embedded in the supporting base 34 in correspondence with the testing connection terminals 22. The contactor device 37 is electrically connected to the burn-in tester 31 by wires (not shown)extending along the beam 33.

The testing operation is as follows. After the semiconductor chips 6 are mounted on each of the semiconductor device mounting portions 2b on the tape carrier 21, the elongated tape carrier 21 is cut along each of the phantom lines II—II in FIG. 1 into the tape sections 21a illustrated in FIG. 2. The semiconductor devices 2 mounted on the tape sections 21a are pre-tested through the testing connection terminals 22 mounted along the outer edge of the tape section 21a. A semiconductor device 2 rejected according to the pre-test result has the testing wires 23 connected to the semiconductor device 2 disconnected by removing the testing wires 23 together with tape material in a slender rectangle enclosed by the phantom line 24 to prevent the rejected semiconductor devices 2 from burning in the burn-in tank 30 illustrated in FIG. 4 upon application of a voltage.

Next, each of the tape sections 21a is held between the supporting base 34 and the swinging holder 35, of the supporting device 32, at a portion near the testing connection terminals 22 thereof. Further, the positioning pins 36 attached to the supporting base 34 are put in the perforations 4 near the testing connection terminals 22 on both sides of the long edges of the tape section 21a. Thus, each of the tape sections 21a is supported by the supporting devices 32 and hung from the beam 33. As illustrated in FIG. 7, since the contactor elements of the contactor 37 are disposed in the supporting base 34 at the same intervals as the testing connection terminals 22 mounted on the tape section 21a, the contactor device 37 and the testing connection terminals 22 are electrically connected by being pressed down by the holder 35. The contactor device 37 is connected to the burn-in tester 31 through the wires which are disposed in the beam 33. Each of the semiconductor devices 2 is subjected to the burn-in test through the testing connection terminals 22 and the contactor device 37 by the burn-in tester 31 at a specified temperature and a voltage while being maintained on the tape sections 21a. After the burn-in test, a final test may be applied to each of the semiconductor devices 2 separately. As all of the outer terminals 5 of the semiconductor device 2 are connected to the testing connection terminals 22, each of the semiconductor devices 2 can be tested by a testing means such as a pin contactor (not shown) while being attached on the tape sections 21a. After the final test, the semiconductor devices 2 are individually cut out from the tape section 21a along a dashed line 25 shown in FIG. 3.

Figure 8:
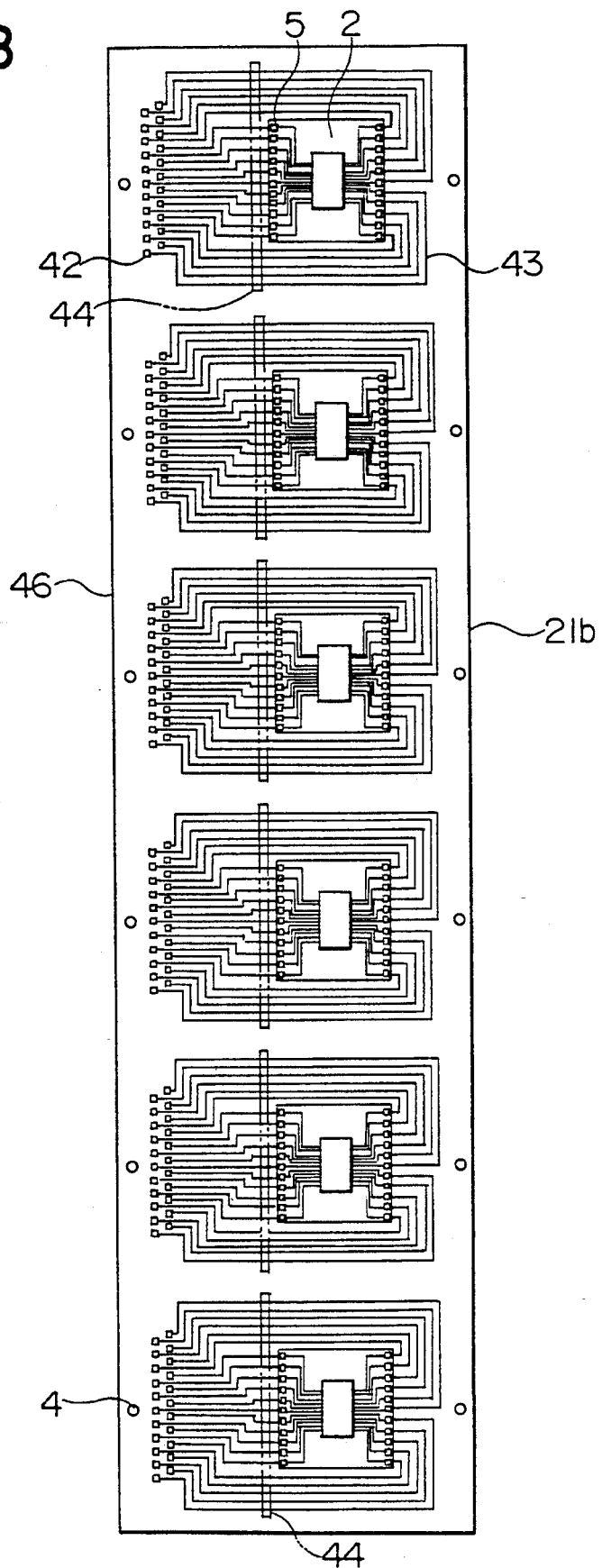
FIG. 8 is a top plan view of another embodiment of the tape carrier of the present invention.
Figure 9:
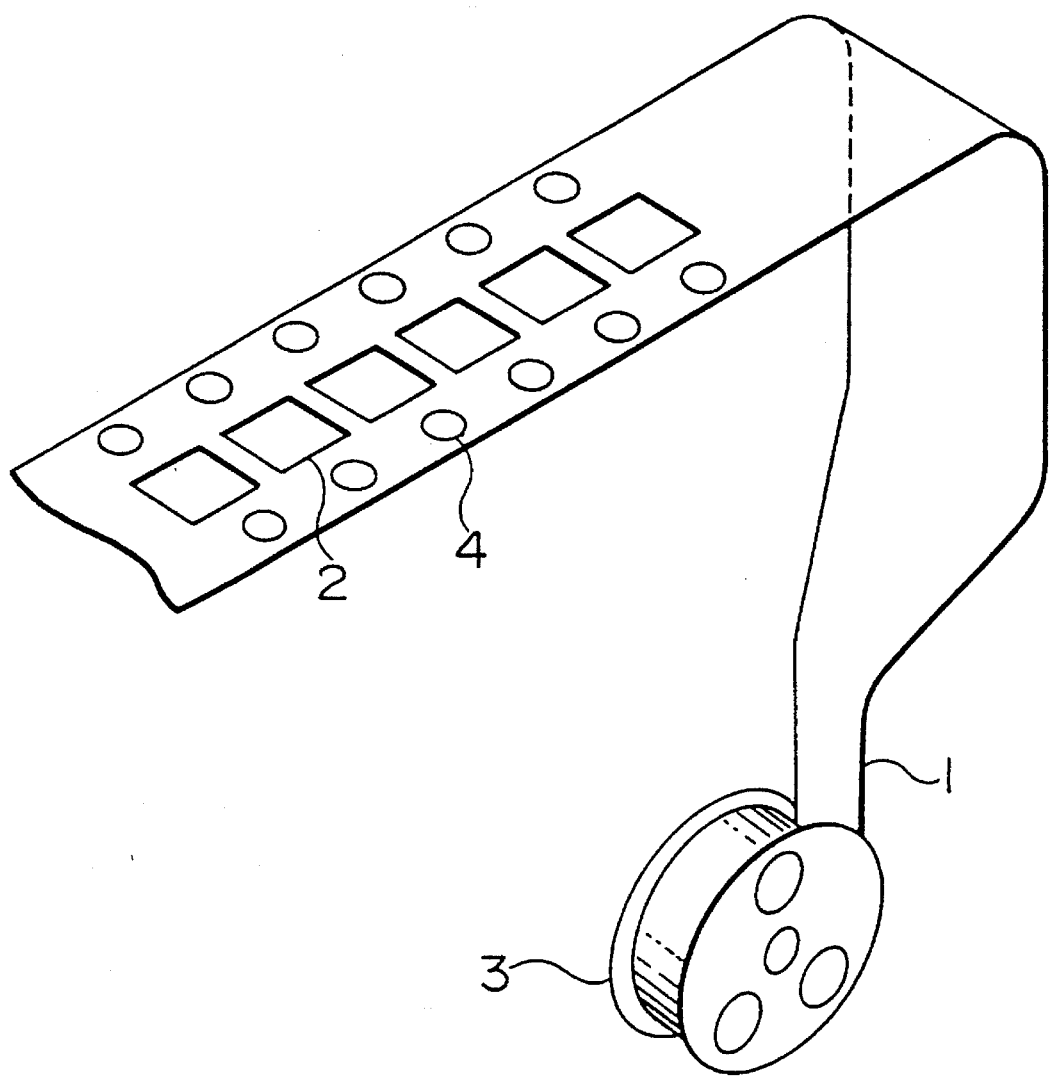
FIG. 9 is a perspective view of a conventional tape carrier.
Figure 10:
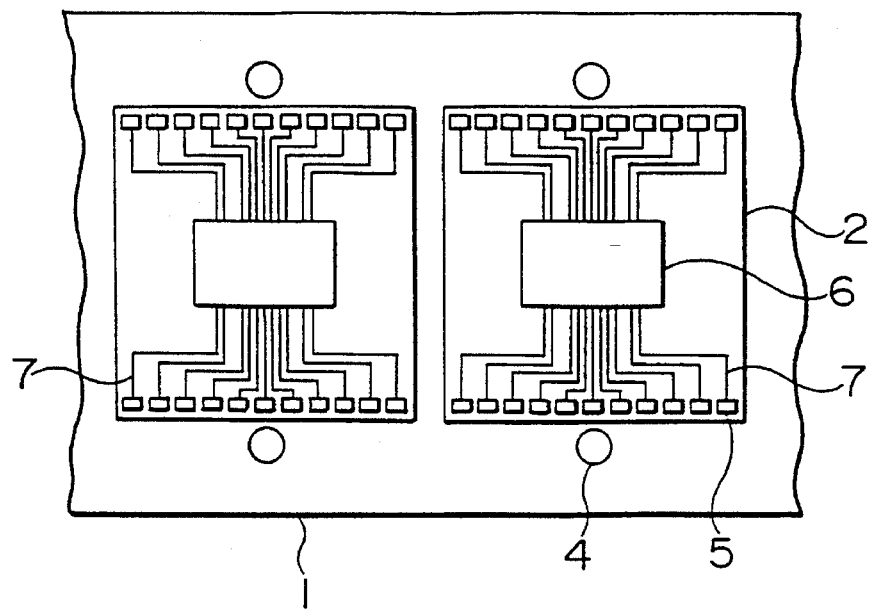
FIG. 10 is an enlarged fragmental top view of the conventional tape carrier illustrated in FIG. 9.
Figure 11:
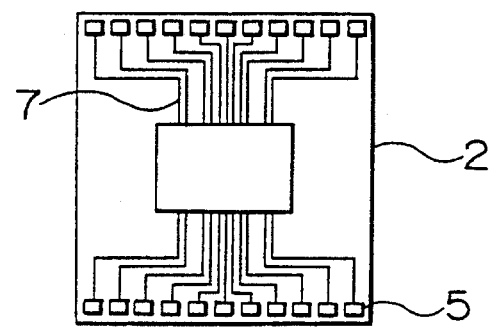
FIG. 11 is a top plan view of a conventional semiconductor device cut from the tape carrier illustrated in FIG. 10.
Figure 12:
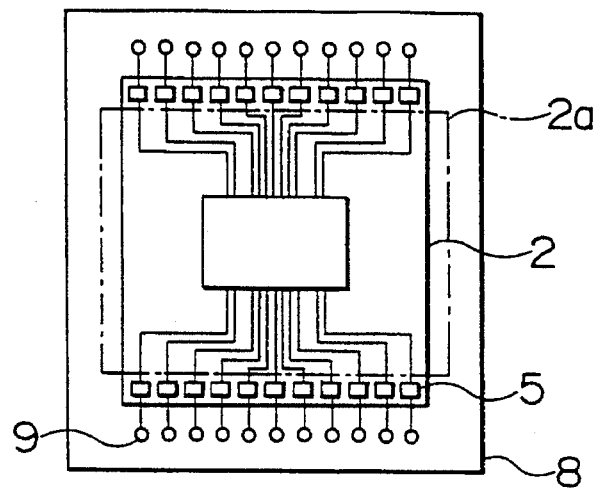
FIG. 12 is a top plan view of a conventional semiconductor device in a socket.
Figure 13:
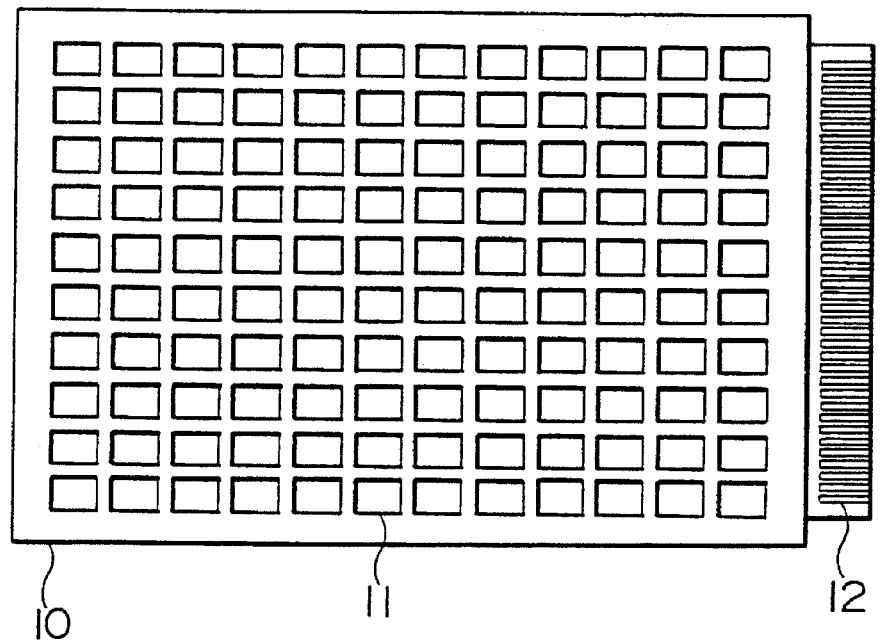
FIG. 13 is a top plan view of a conventional testing board.

FIG. 8 illustrates another embodiment of the tape section of the tape carrier of the present invention, which has basically the same structure as that illustrated in FIGS. 1 and 2 but is different in one point. The structure of the semiconductor device 2 is completely the same. The different structure is the mounting position of testing connection terminals 42. The testing connection terminals 42 are mounted along one of the longer outer edges 46 of the tape section 21b for each of the semiconductor devices 2. The testing connection terminals 42 are electrically connected to the outer terminals 5 of the semiconductor device 2 through the testing wires 43 on the tape section 21b. Since the mounting position of the testing connection terminals 42 is different, the wirings of the testing wires 43 are also different from that illustrated in FIG. 2. In this embodiment, each of the testing connection terminals 42 is connected to the respective one of the outer terminals 5 in a one-to-one relationship.

In this embodiment, similarly to the above embodiment, the semiconductor devices 2 rejected according to a test result can be disconnected by removing testing wires 43 together with tape material in a rectangle 44.

As the testing connection terminals 42 are disposed along the longer outer edge of the tape section 21b in this embodiment, each of the tape sections 21b is supported at a portion near the testing-connection terminals 42 and hung by a supporting device (not shown), which may have the same structure as that of the supporting device 32 illustrated in FIG. 5, within the burn-in tank 30 illustrated in FIG. 4.

If it is desired, the testing connection terminals 22 or 42 may be formed along both outer edges of the tape section 21a or 21b. In that case, two contactor devices similar to the contactor device 37 are needed for electrically contacting the testing connection terminals 22 or 42 mounted at two portions.

The tape carrier and the semiconductor device test apparatus of the present invention may also be applied in another tests such as a monitored burn-in test in which the semiconductor device operation is monitored while the semiconductor device is in a constant temperature tank under a load.

What is claimed is:

1. A tape carrier comprising:
   an elongated electrically insulating tape having four outer edges and divisible into a plurality of separable tape sections, each tape section having:
      a semiconductor device mounting portion; and
      a plurality of leads for electrical connection to a semiconductor chip mounted at the respective mounting portion;
   a plurality of testing connection terminals disposed along one of the outer edges of the tape; and
   a plurality of testing wires, each testing wire connecting a single, different one of the testing connection terminals to at least one of the leads, wherein each of the leads is connected to one of the testing connection terminals disposed along one of the outer edges of the tape by one of the testing wires and at least some of the testing connection terminals are connected by the testing wires to more than one of the leads in the respective tape sections.

2. The tape carrier as claimed in claim 1 wherein the outer edges comprise two longer edges and two shorter edges and including a plurality of perforations in the tape along the longer edges for feeding and positioning the tape.

3. A tape carrier comprising:
   an elongated electrically insulating tape having four outer edges and divisible into a plurality of separable tape sections, each tape section having;
      a semiconductor device mounting portion; and
      a plurality of leads for electrical connection to a semiconductor chip mounted at the respective mounting portion;
   a plurality of testing connection terminals disposed along one of the outer edges of the tape; and
   a plurality of testing wires, each testing wire connecting a single, different one of the testing connection terminals to at least one of the leads, wherein each of the leads is connected to one of the testing connection terminals disposed along one of the outer edges of the tape by one of the testing wires, the outer edges comprise a pair of longer edges and a pair of shorter edges and the testing connection terminals are disposed only along one of the shorter edges of the tape.

4. A tape carrier comprising;
   an elongated electrically insulating tape having four outer edges and divisible into plurality of separable tape sections, each tape section having:
      a semiconductor device mounting portion; and
      a plurality of leads for electrical connection to a semiconductor chip mounted at the respective mounting portion;

a plurality of testing connection terminals disposed along one of the outer edges of the tape; and a plurality of testing wires, each testing wire connecting a single, different one of the testing connection terminals to at least one of the leads, wherein each of the leads is connected to one of the testing connection terminals disposed along one of the outer edges of the tape by one of the testing wires, the outer edges comprise a pair of longer edges and a pair of shorter edges, and the testing connection terminals are disposed along only one of the longer edges of the tape.

5. A tape carrier comprising:

an elongated electrically insulating tape having four outer edges and divisible into a plurality of separable tape sections, each tape section having:
   a semiconductor device mounting portion; and
   a plurality of leads for electrical connection to a semiconductor chip mounted at the respective mounting portion;

a plurality of testing connection terminals disposed along one of the outer edges of the tape;

a plurality of testing wires, each testing wire connecting a single, different one of the testing connection terminals to at least one of the leads, wherein each of the leads is connected to one of the testing connection terminals disposed along one of the outer edges of the tape by one of the testing wires; and connecting means traversing the testing wires for selectively disconnecting testing wires from the leads at respective mounting portions.

6. A tape carrier comprising:

an elongated electrically insulating tape having four outer edges and divisible into a plurality of separable tape sections, each tape section having:
   a semiconductor device mounting portion; and
   a plurality of leads for electrical connection to a semiconductor chip mounted at the respective mounting portion; and a plurality of testing connection terminals disposed along only one of the outer edges of the tape; and a plurality of testing wires, each testing wire connecting a single, different one of the testing connection terminals to at least one of the leads, wherein each of the leads is connected to one of the testing connection terminals disposed along only one of the outer edges of the tape by one of the testing wires.

7. The tape carrier as claimed in claim 6 wherein the outer edges comprise two longer edges and two shorter edges and including a plurality of perforations in the tape along the longer edges for feeding and positioning the tape.

8. The tape carrier as claimed in claim 6 wherein at least some of the testing connection terminals are connected by the testing wires to more than one of the leads in the respective tape sections.

9. The tape carrier as claimed in claim 6 wherein the outer edges comprise a pair of longer edges and a pair of shorter edges and the testing connection terminals are disposed only along one of the shorter edges of the tape.

10. The tape carrier as claimed in claim 6 wherein the outer edges comprise a pair of longer edges and a pair of shorter edges and the testing connection terminals are disposed along only one of the longer edges of the tape.

11. The tape carrier as claimed in claim 6 comprising disconnecting means traversing the testing wires for selectively disconnecting testing wires from the leads at respective mounting portions.

* * * * *